United States Patent
Yoo et al.

(10) Patent No.: US 8,278,642 B2
(45) Date of Patent: Oct. 2, 2012

(54) RESISTIVE RANDOM ACCESS MEMORY DEVICE AND METHOD OF SAME

(75) Inventors: Kyung-Hwa Yoo, Seoul (KR); Sung In Kim, Seoul (KR); Jae Hak Lee, Seoul (KR); Young Wook Chang, Seoul (KR)

(73) Assignee: Industry-Academic Cooperation Foundation Yonsei University (KR)

( * ) Notice: Subject to any disclaimer, the term of this patent is extended or adjusted under 35 U.S.C. 154(b) by 259 days.

(21) Appl. No.: 12/682,547

(22) PCT Filed: Oct. 10, 2008

(86) PCT No.: PCT/KR2008/005984
§ 371 (c)(1),
(2), (4) Date: Apr. 9, 2010

(87) PCT Pub. No.: WO2009/048301
PCT Pub. Date: Apr. 16, 2009

(65) Prior Publication Data
US 2010/0270528 A1    Oct. 28, 2010

(30) Foreign Application Priority Data
Oct. 12, 2007 (KR) .................. 10-2007-0103116

(51) Int. Cl.
*H01L 47/00* (2006.01)
(52) U.S. Cl. .................. 257/4; 438/382; 977/762
(58) Field of Classification Search ......... 257/2–5; 438/382; 977/762, 763, 781, 782, 811, 893
See application file for complete search history.

(56) References Cited

U.S. PATENT DOCUMENTS

| 6,231,744 B1 * | 5/2001 | Ying et al. ............. 205/324 |
| 7,446,333 B2 | 11/2008 | Kim et al. ............. 257/3 |
| 2006/0060832 A1 | 3/2006 | Symanczyk et al. ..... 257/3 |

FOREIGN PATENT DOCUMENTS

| JP | 2007-180174 | 7/2007 |
| KR | 1020060050833 | 5/2006 |
| KR | 100647333 | 11/2006 |
| KR | 100727650 | 6/2007 |

* cited by examiner

*Primary Examiner* — Julio J Maldonado
*Assistant Examiner* — Sonya McCall Shepard
(74) *Attorney, Agent, or Firm* — Hayes Soloway P.C.

(57) ABSTRACT

Disclosed are a resistive random access memory device (ReRAM) and a method for manufacturing the same. The ReRAM includes a cell array including a metal oxide nanowire formed inside a micropore array of a porous template, a first electrode electrically connected to an upper protrusion of the metal oxide nanowire, the upper protrusion being exposed to an upper portion of the porous template, and located in an upper portion of the cell array, and a second electrode electrically connected to a lower protrusion of the metal oxide nanowire, the lower protrusion being exposed to a lower portion of the porous template, and located in a lower portion of the cell array.

15 Claims, 10 Drawing Sheets

RESISTIVE RANDOM ACCESS MEMORY DEVICE AND METHOD OF SAME

TECHNICAL FIELD

The present invention relates to a resistive random access device (ReRAM) and a method for manufacturing the same, and more particularly, to an ReRAM that may include a cell array formed by performing an electrodeposition with respect to a metal oxide nanowire on a porous aluminum oxide (PAO) template, and a method for manufacturing the same.

BACKGROUND ART

In the current information and communication society, demands for a semiconductor device that may more rapidly process more information so as to perform a two-way communication by variously using text, voices, images, and the like are increased. However, a volatile memory of current storage devices has reached limitations in its growth, and accordingly the next generation memory to replace this volatile memory is required to be developed. Development of a non-volatile memory device enabling ultra-large-scale integration required for high capacity information storage is in high demand.

A resistive random access memory device (ReRAM) among the non-volatile memories is a non-volatile memory in which electric resistance of materials is changed by means of an external voltage and the change in the electric resistance is used to signify On/Off. The ReRAM may act as one of next generation non-volatile memory devices for replacing current memory devices in markets mainly occupied by Dynamic RAMs (DRAMs) and flash memories. Accordingly, the ReRAM is highly expected to implement high integration because of a relatively simple structure in comparison with other types of non-volatile memories.

The ReRAM may be embodied to have various materials and structures, however, binary oxides, perovskite oxides containing manganese (Mn), and perovskite oxides with a small amount of doped metal are generally used. Development of the ReRAM using oxide-based materials may be expected to increase a degree of integration of the non-volatile memory device, thereby finding a new memory device market and rapidly improving performance of various electronic devices.

However, oxides used in the conventional ReRAM are of a thin film type formed by physical vapor deposition (PVD), chemical vapor deposition (CVD), and other sputtering methods. Due to complexity of the entire process and a requirement for a high vacuum condition, the conventional process for manufacturing these oxide thin films have problems in that the manufacturing cost is high, reproducibility of the process and the ultra-large-scale integration are difficult to be realized.

DISCLOSURE OF INVENTION

Technical Goals

An aspect of the present invention provides a resistive random access memory device (ReRAM) that may include a cell array formed by performing an electrodeposition with respect to a metal oxide nanowire on a porous aluminum oxide (PAO) template, thereby achieving a low manufacturing cost, and enabling ultra-large-scale integration through a simple manufacturing process.

Technical Solutions

According to an aspect of the present invention, there is provided a resistive random access memory device (ReRAM), including: a cell array including a metal oxide nanowire formed inside a micropore array of a porous template; a first electrode electrically connected to an upper protrusion of the metal oxide nanowire, the upper protrusion being exposed to an upper portion of the porous template, and located in an upper portion of the cell array; and a second electrode electrically connected to a lower protrusion of the metal oxide nanowire, the lower protrusion being exposed to a lower portion of the porous template, and located in a lower portion of the cell array.

According to an aspect of the present invention, there is provided a method for manufacturing an ReRAM, the method including: performing an electrodeposition with respect to a metal oxide nanowire inside a micropore array of a porous template to form a cell array; forming a first electrode on an upper portion of the cell array; and forming a second electrode on a lower portion of the cell array.

Advantageous Effects

As described above, according to the present invention, there is provided a ReRAM which may include a cell array formed by performing the electrodepostion with respect to the metal oxide nanowire on the PAO template enabling the ultra-large-scale integration through a low manufacturing cost and a simple manufacturing process.

BEST MODE FOR CARRYING OUT THE INVENTION

Figure 1:
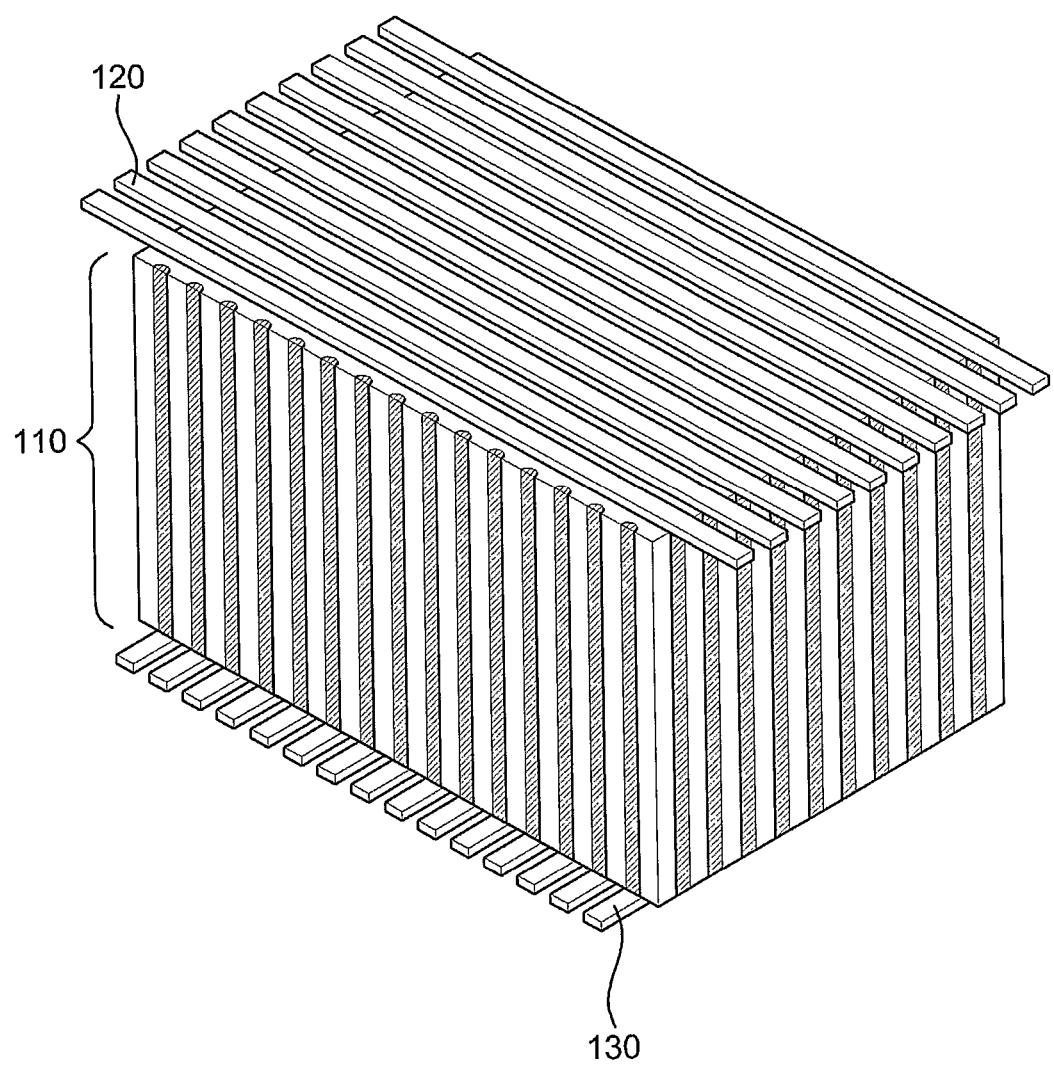
FIG. 1 illustrates an integrated resistive random access memory device (ReRAM) including a cell array according to an exemplary embodiment of the present invention.

Reference will now be made in detail to embodiments of the present invention, examples of which are illustrated in the accompanying drawings, wherein like reference numerals refer to the like elements throughout. The embodiments are described below in order to explain the present invention by referring to the figures. When detailed descriptions related to a well-known related function or configuration are determined to make the spirits of the present invention ambiguous, the detailed descriptions will be omitted herein. Also, terms used throughout the present specification are used to appropriately describe exemplary embodiments of the present invention, and thus may be different depending upon a user and an operator's intention, or practices of application fields of the present invention. Therefore, the terms must be defined based on descriptions made through the present invention.

FIG. 1 illustrates an integrated resistive random access memory device (ReRAM) including a cell array according to an exemplary embodiment of the present invention.

Referring to FIG. 1, the ReRAM of the present exemplary embodiment includes a cell array 110, a first electrode 120 located in an upper portion of the cell array 110, and a second electrode 130 located in a lower portion of the cell array 110. The cell array 110 includes a metal oxide nanowire formed inside a micropore array of a porous template. The first electrode 120 is electrically connected to an upper protrusion of the metal oxide nanowire, which is exposed to an upper portion of the porous template, and the second electrode 130 is electrically connected to a lower protrusion of the metal oxide nanowire, which is exposed to a lower portion of the porous template.

The ReRAM of the present exemplary embodiment may be manufactured such that an electrodeposition with respect to the metal oxide nanowire is performed inside the micropore array of the porous template to thereby form the cell array 110, and the first electrode 120 is formed on the upper portion of the cell array 110, and the second electrode 130 is formed on the lower portion of the cell array 110.

The porous template may be a porous aluminum oxide (PAO) template formed by anodizing an aluminum plate or aluminum film. A method for manufacturing the porous template will be described in detail with respect to FIG. 2.

The metal oxide nanowire may be formed by an electrodeposition method inside the micropore array of the porous template, and the metal oxide nanowire may be any one of NiO, $TiO_2$, $VO_2$, $Fe_2O_3$, $CoO_2$, $WO_3$, $RuO_2$, $IrO_2$, and $SnO_2$. Also, the first and second electrodes 120 and 130 may include a metal thin film of any one selected from a group consisting of Au, Pt, Al, Ag, Cr, and Cu.

A single memory cell may be formed at a portion where the first and second electrodes 120 and 130 are mutually crossed, the metal oxide nanowire formed inside the micropore array of the porous template may exhibit memory device characteristics of resistance change by a voltage applied via the first or second electrode 120 or 130, and a resistance change rate, which will be described in detail later, has a range of 100,000-fold to 1,000,000-fold.

The ReRAM of the present exemplary embodiment is a two-terminal element including the first and second electrodes 120 and 130, and thereby ultra-large-scale integration is relatively readily enabled in comparison with a Field Effect Transistor (FET) of a three-terminal element.

FIGS. 2 to 6 illustrate a process flow of a method for manufacturing a porous template according to an exemplary embodiment of the present invention.

In FIGS. 2 to 6, the porous template is a PAO template formed by anodizing an aluminum plate or aluminum film, however, the porous template of the present exemplary embodiment is not limited thereto.

The PAO template according to present exemplary embodiment may use an anodization method performed such that an anodized part is vertically formed by applying a Direct Current (DC) voltage to an aluminum metal and oxidizing, and a micropore array is formed on the anodized part. Specifically, aluminum is electrically oxidized in an acidic solution, oxygen and aluminum are combined to thereby form an aluminum oxide film on a surface of the aluminum metal, and the aluminum where the oxidization is generated is used as a positive electrode.

Figure 2:
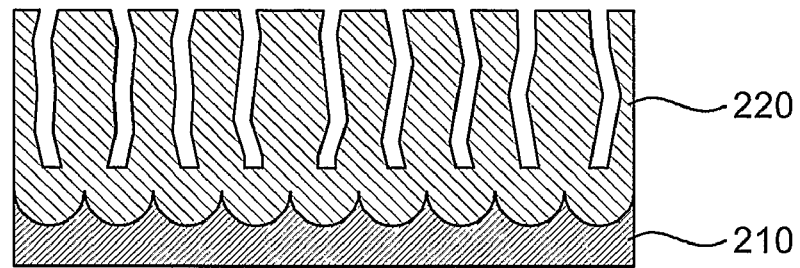
FIGS. 2 to 6 illustrate a process flow of a method for manufacturing a porous template according to an exemplary embodiment of the present invention.

Referring to FIGS. 2 to 6, a first anodization with respect to a metal substrate such as an aluminum substrate 210 is performed to thereby form an aluminum oxide 220 on the upper portion of the aluminum substrate 210 (FIG. 2). A micropore in a vertical direction is formed on a surface of the aluminum oxide 220 by the first anodization, however, an array of the micropore is irregularly arranged.

Figure 3:
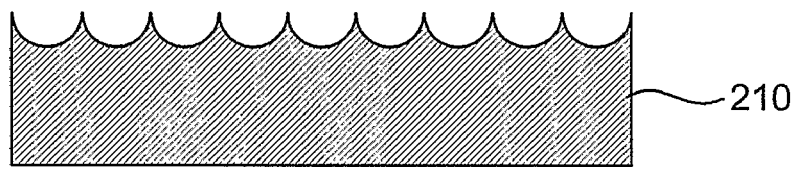
Figure 4:
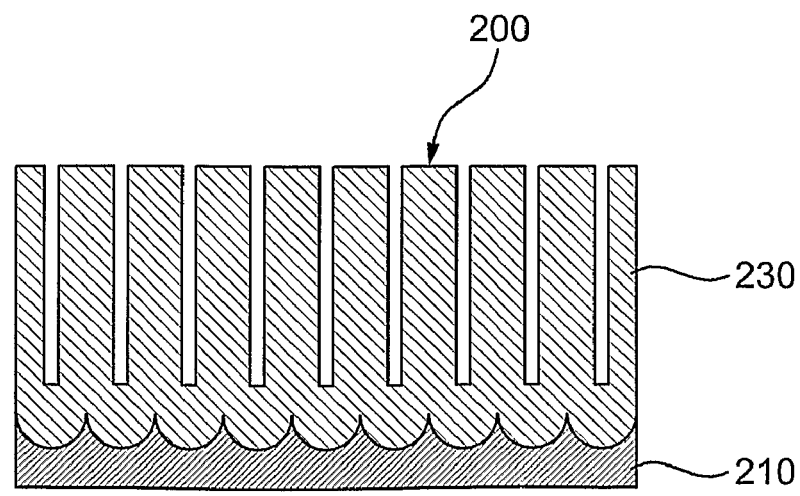
Figure 5:
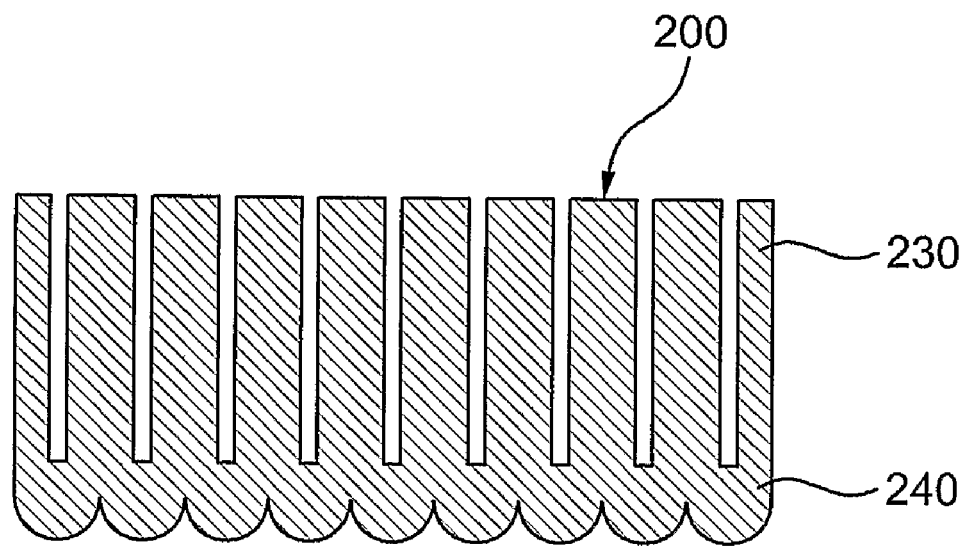
Figure 6:
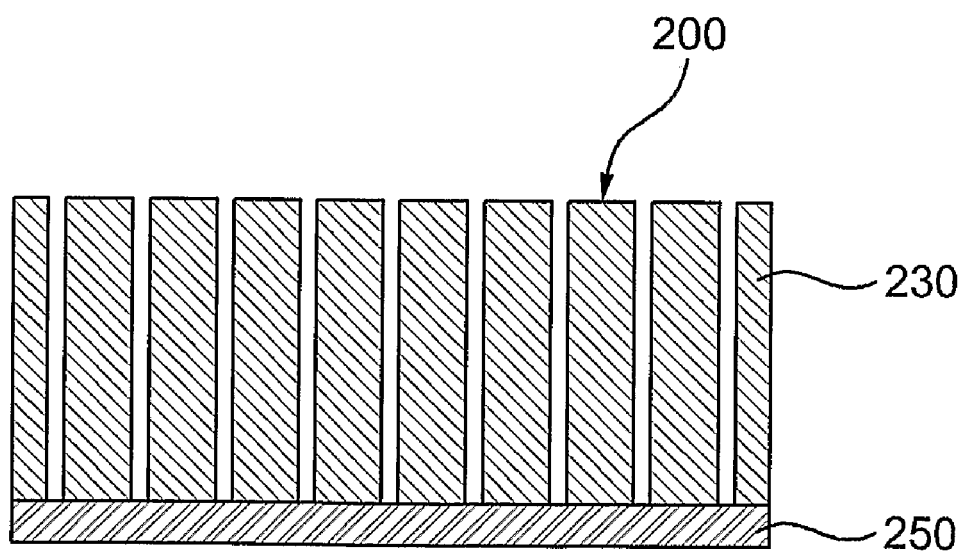

The aluminum oxide 220 is eliminated from the aluminum substrate 210 as shown in FIG. 3, and a second anodization with respect to the aluminum substrate 210 is performed to thereby form a porous template including an anodized part 230 where the micropore array is regularly arranged as shown in FIG. 4. Thereafter, as shown in FIG. 5, a PAO template 200 is eliminated from the aluminum substrate 210. In FIG. 6, a barrier layer 240 forming the lower portion of the micropore array of the PAO template 200 is eliminated from the PAO template 200, and a metal thin film 250 is deposited on a surface of the PAO template 200. The metal thin film 250 may include a metal thin film selected from any one selected from a group consisting of Au, Pt, Al, Ag, Cr, and Cu.

When an electrodeposition with respect to the metal oxide nanowire is performed on the PAO template formed as described above, a memory cell of the ReRAM, that is, a cell array may be formed.

Hereinafter, the present invention will be described in detail by examples. It is to be understood, however, that these examples are for illustrative purpose only, and are not construed to limit the scope of the present invention.

Example 1

Under an applied voltage of 40 V, a temperature of 5° C., and $C_2H_2O_4$ having a concentration of 0.3 M acting as an electrolyte for the anodization, a first anodization was performed for about 6 hours, and then an aluminum oxide formed on an aluminum substrate was dissolved in a mixed solution of $H_2CrO_4$ of 1.8 wt % and $H_3PO_4$ of 6 wt % at 60° C. and for about 6 hours. As a result, the aluminum oxide was completely eliminated from the aluminum substrate, and a dimple was formed on the aluminum substrate. Next, when a second anodization was performed on the aluminum substrate with the dimple formed thereon under the same condition as that in the first anodization for about 12 hours, a porous aluminum oxide (PAO) template including a micropore array regularly arranged was formed. The formed PAO template was separated from the aluminum substrate by applying a voltage of 45 V in a mixed solution of $HClO_4$ and $C_2H_5OH$ in the volume ratio of 1:1. An alumina barrier layer of the separated PAO template was immersed in $H_3PO_4$ of 6 wt % at room temperature for about 30 minutes, thereby eliminating the alumina barrier layer. Also, in order to manufacture a conductive thin film required for the electrodeposition, an Au thin film was deposited on a surface of the PAO template by a 2000 Å thickness.

Figure 7:
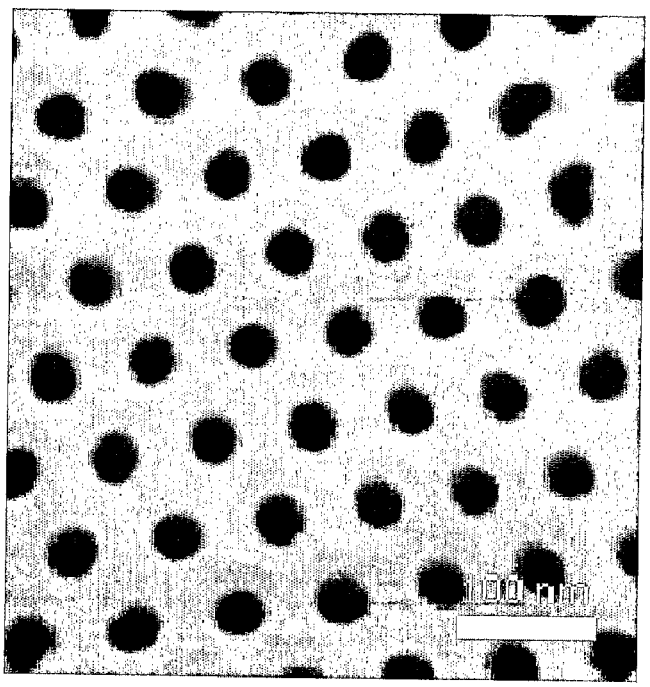
FIGS. 7 and 8 are Scanning Electron Microscopy (SEM) images respectively showing top and side surfaces of a porous aluminum oxide (PAO) template manufactured in Example 1.
Figure 8:
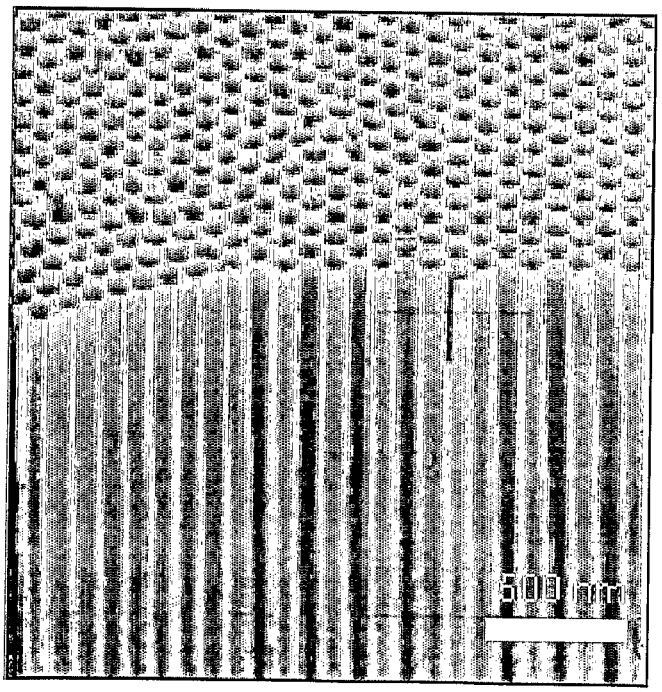

FIGS. 7 and 8 are Scanning Electron Microscopy (SEM) images showing top and side surfaces of a porous aluminum oxide (PAO) template manufactured in Example 1, respectively. Referring to FIGS. 7 and 8, the PAO template manufactured in Example 1 includes a micropore array regularly arranged, and the micropore array is extended in a lengthwise direction of the anodized part. A micropore of the micropore array has a diameter of about 10 to 100 nm.

FIGS. 9 to 12 illustrate a process flow of a method for performing an electrodeposition with respect to a metal oxide on a porous template according to an exemplary embodiment of the present invention.

Figure 9:
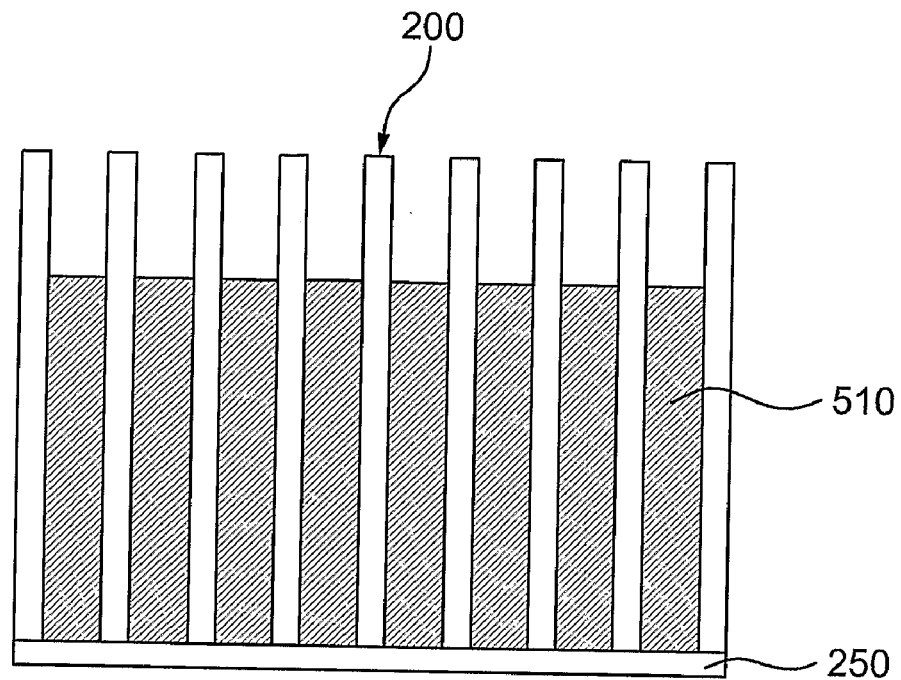
FIGS. 9 to 12 illustrate a process flow of a method for performing an electrodeposition with respect to a metal oxide on a porous template according to an exemplary embodiment of the present invention.
Figure 10:
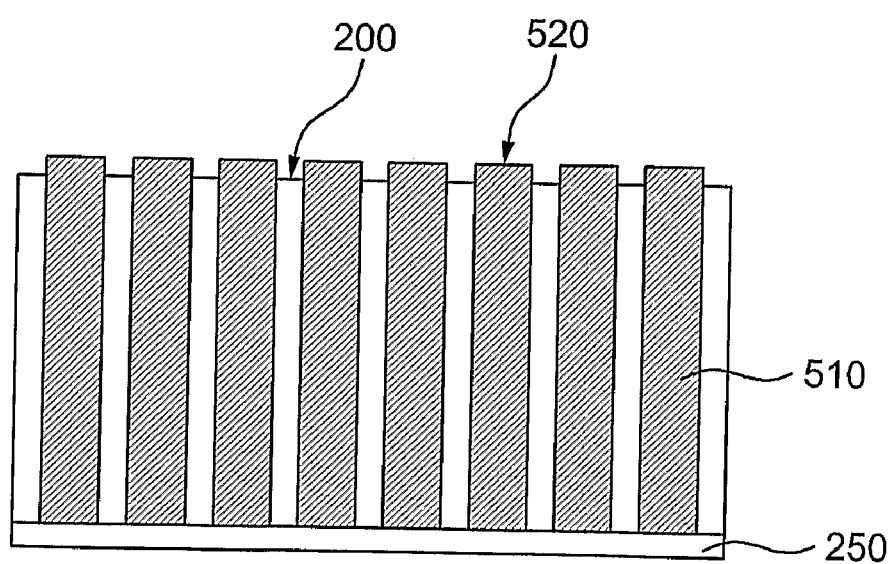
Figure 11:
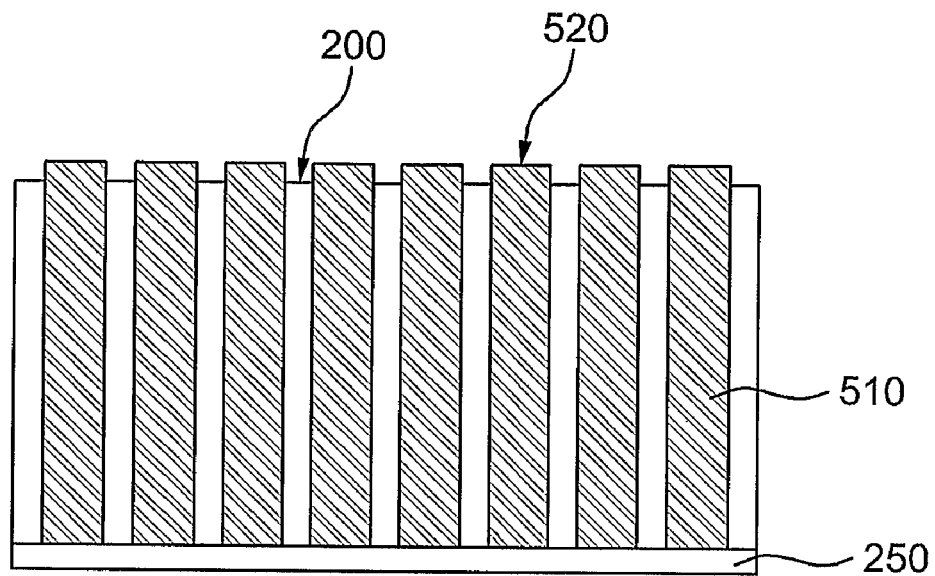
Figure 12:
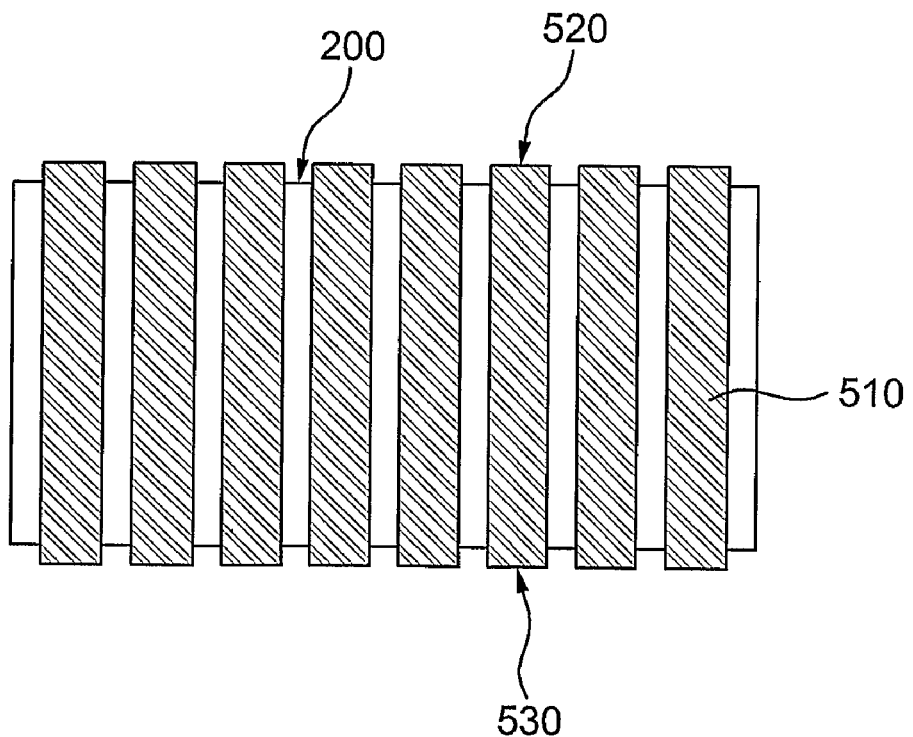

Referring to FIGS. 9 to 12, in FIG. 9, the metal thin film 250 such as Au is deposited on a bottom surface of the PAO template 200, and then a metal nanowire 510 is sufficiently formed inside the micropore array of the PAO template 200. Thereafter, in FIG. 10, an upper end 520 of the PAO template was partially etched using a H3PO4 solution of 10 wt %, so that the metal nanowire was exposed to the upper portion of the porous template. Next, in FIG. 11, the metal nanowire inside the micropore array of the PAO template 200 was oxidized using a metal oxide nanowire under a predetermined condition, and then in FIG. 12, a lower metal thin film of the PAO template 200 was etched, so that a lower protrusion 530 of the metal oxide nanowire was exposed to the lower portion of the PAO template 200. The PAO template formed as described above including the metal oxide nanowire inside the micropore array may form a cell array of the ReRAM. The ReRam may be manufactured when the first and second electrodes are formed on the upper and lower portions of the cell array, respectively. The PAO template 200 may be a PAO template formed by performing an anodization with respect to an aluminum plate or an aluminum film, and the first or second electrode may include a metal thin film of any one selected from a group consisting of Au, Pt, Al, Ag, Cr, and Cu. The metal oxide nanowire may be any one of $NiO$, $TiO_2$, $VO_2$, $Fe_2O_3$, $CoO_2$, $WO_3$, $RuO_2$, $IrO_2$, and $SnO_2$. Hereinafter, an example of manufacturing a cell array will be described in detail according to an actual process of the present invention.

Example 2

As a prior step for manufacturing a nickel oxide (NiO) nanowire, a nickel nanowire was first manufactured. In order to manufacture the nickel nanowire, Au was deposited on a bottom surface of the PAO template to thereby manufacture a working electrode, and the nickel nanowire was manufactured using an electrodeposition method. As an electrolyte for the electrodeposition, a mixed solution of $NiSO_4 \cdot 6H_2O$ of 0.3 M and $H_3BO_3$ of 0.67 M was used. A pH of the electrolyte solution was adjusted to be maintained with a pH of about 2 to 3 while adding a sulfuric acid solution. The nickel nanowire was plated in the PAO template with a constant-current of about 3 $mA/cm^2$ using a potentiostat (Princeton Applied Research, Powersuite 2.40). The potentiostat includes a platinum counter electrode, a reference electrode (Ag/AgCl in 3.5 M KCl solution), and a working electrode (a PAO template on which a metal thin film is deposited), and a constant voltage or current was applied between the counter electrode and the working electrode. Thereafter, in order to oxide the nickel nanowire existing in the PAO template to the NiO nanowire, the upper end of the PAO template was partially etched using a H3PO4 solution of 10 wt %, and then was oxidized at 450° C. for about 5 hours in the air.

Figure 13:
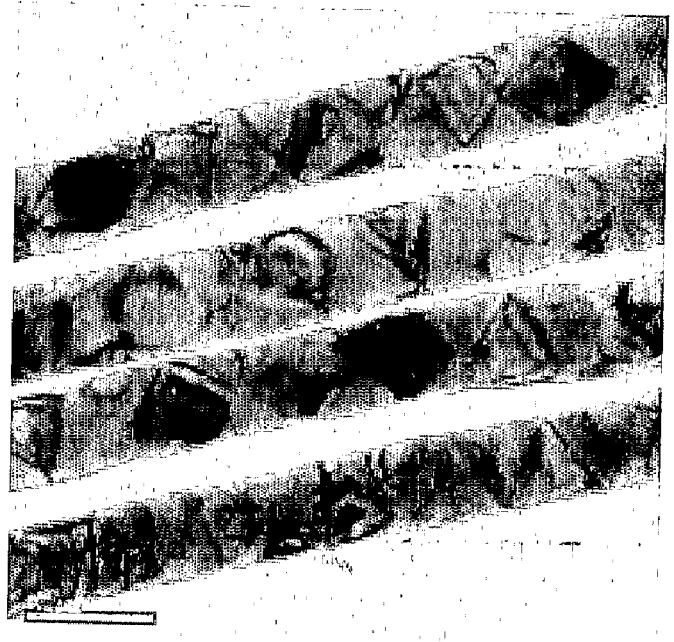
FIGS. 13 and 14 are Transmission Electron Microscopy (TEM) images of a nickel oxide (NiO) nanowire completely separated from the PAO template of Example 2.
Figure 14:
Figure 15:
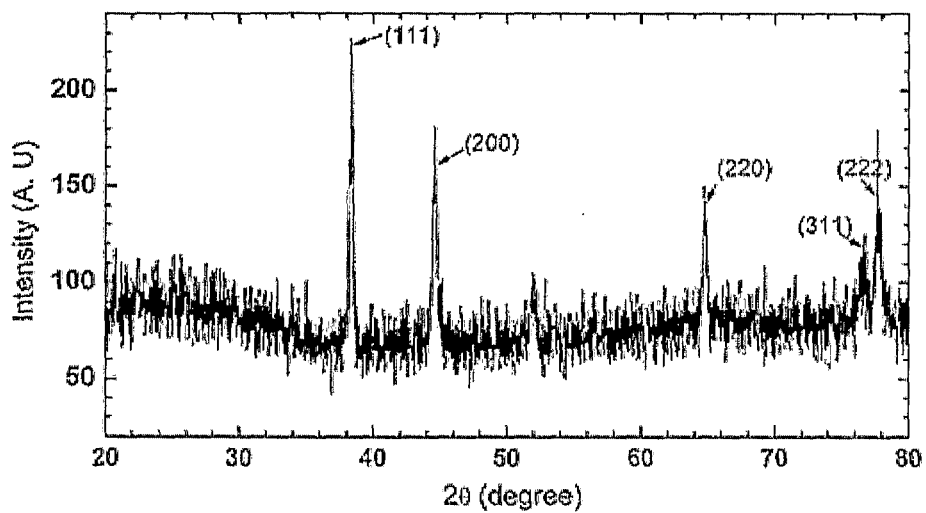
FIG. 15 is a graph illustrating an X-Ray Diffraction (XRD) pattern of the separated NiO nanowire of FIG. 13.

FIGS. 13 and 14 are Transmission Electron Microscopy (TEM) images of a NiO nanowire completely separated from the PAO template of Example 2, and FIG. 15 is a graph illustrating an X-Ray Diffraction (XRD) pattern of the separated NiO nanowire of FIG. 13. Referring to FIGS. 13 and 14, a mean diameter of the NiO nanowire is about 80 nm, and has a polycrystalline structure. Referring to FIG. 15, a position of a diffraction peak is the same as that of a diffraction peak of a standard powder NiO. Accordingly, the NiO nanowire manufactured using the electrodepostion method corresponds to a polycrystalline NiO nanowire.

Figure 16:
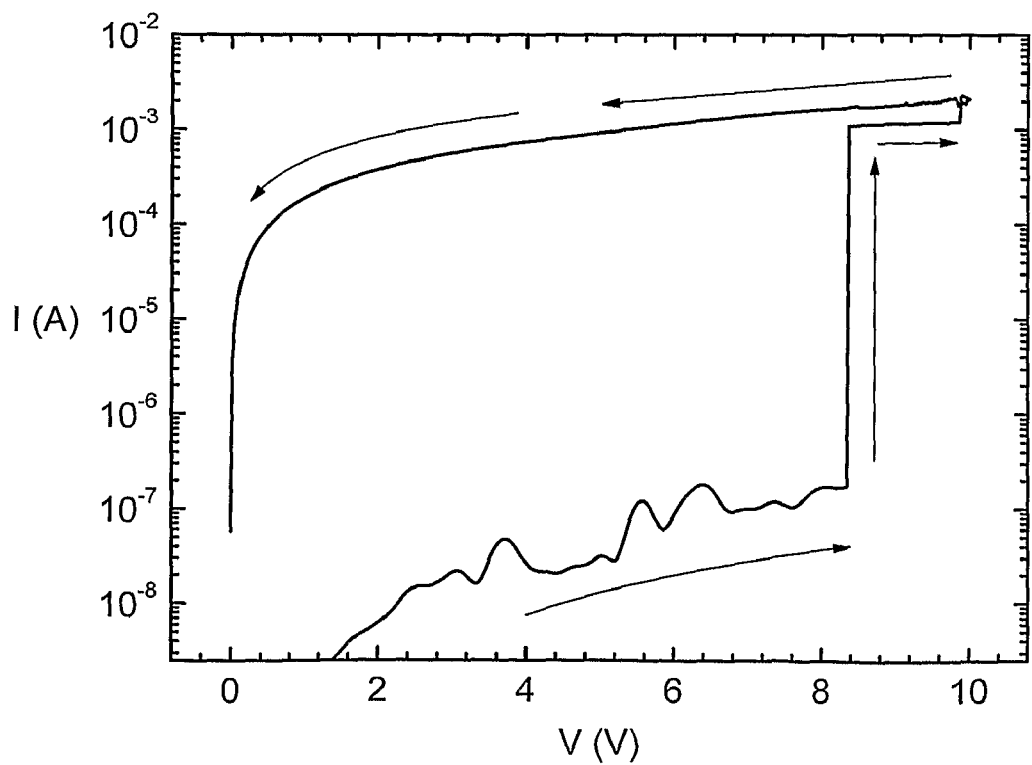
FIG. 16 is a graph illustrating resistance change characteristics in a positive voltage direction of a cell array of a resistive random access memory device according to an exemplary embodiment of the present invention.
Figure 17:
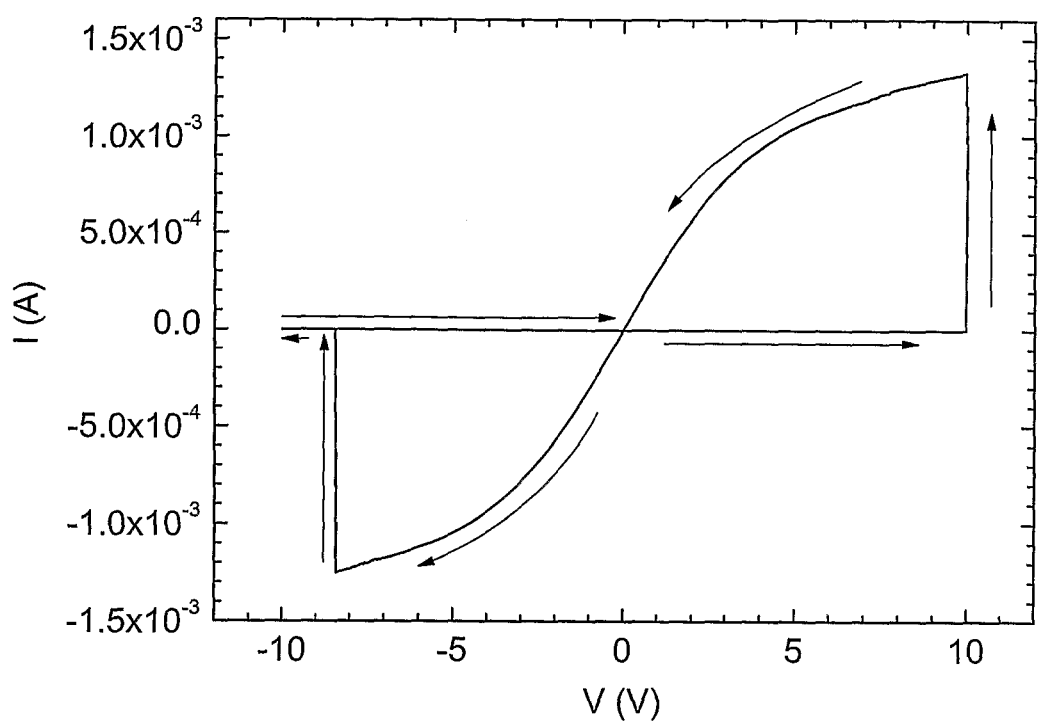
FIG. 17 illustrates resistance change characteristics based on a change in an applied voltage.

FIG. 16 is a graph illustrating resistance change characteristics in a positive voltage direction of a cell array of a resistive random access memory device according to an exemplary embodiment of the present invention, and FIG. 17 illustrates resistance change characteristics based on a change in an applied voltage.

Referring to FIG. 16, an Off-state ranging to 100 MΩ is rapidly changed to an On-state ranging to 10 kΩ when an applied voltage is 8 V, and about 10,000-fold difference in resistance rates at the Off-state and On-state may be created. Referring to FIG. 17, an arrow direction represents a current change direction according to change in an applied voltage, and the ReRAM maintains the Off-state when the applied voltage is changed from −10V to +10V. However, the On-state is maintained even though the applied voltage is changed until again becoming −10V after rapidly becoming the On-state at +10V.

Figure 18:
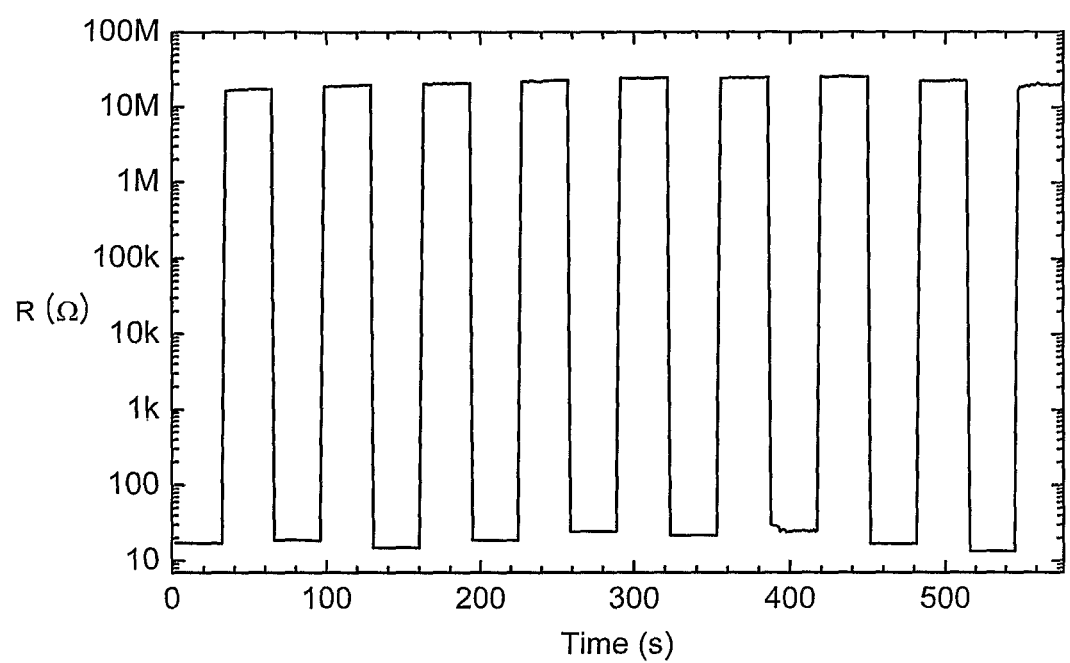
FIG. 18 illustrates memory characteristic of a NiO nanowire according to an exemplary embodiment of the present invention.

FIG. 18 illustrates memory characteristic of a NiO nanowire according to an exemplary embodiment of the present invention.

Referring to FIG. 18, in order to generate the resistance change, a momentary applied voltage at the Off-state is −10V, and a momentary applied voltage at the On-state is +10V, and an applied voltage of +0.5V is maintained to measure the resistance of the ReRAM. The resistance at the Off-state has a range of 10Ω to 100Ω, and the resistance at the On-state has a range of 10 MΩ to 100 MΩ. This resistance change rate has a range of 100,000-fold to 1,000,000-fold.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A resistive random access memory device (ReRAM), comprising:
   a cell array including a metal oxide nanowire formed inside a micropore array of a porous template;
   a first electrode electrically connected to an upper protrusion of the metal oxide nanowire, the upper protrusion being exposed to an upper portion of the porous template, and located in an upper portion of the cell array; and
   a second electrode electrically connected to a lower protrusion of the metal oxide nanowire, the lower protrusion being exposed to a lower portion of the porous template, and located in a lower portion of the cell array.

2. The ReRAM of claim 1, wherein the porous template is a porous aluminum oxide (PAO) template formed by anodizing an aluminum plate or aluminum film.

3. The ReRAM of claim 2, wherein a micropore of the micropore array has a diameter of about 10 to 100 nm.

4. The ReRAM of claim 1, wherein the metal oxide nanowire is any one of $NiO$, $TiO_2$, $VO_2$, $Fe_2O_3$, $CoO_2$, $WO_3$, $RuO_2$, $IrO_2$, and $SnO_2$.

5. The ReRAM of claim 1, wherein the metal oxide nanowire has a diameter of about 10 to 100 nm and a length of about 1 to 20 um.

6. The ReRAM of claim 1, wherein the first electrode or the second electrode includes a metal thin film of any one selected from a group consisting of Au, Pt, Al, Ag, Cr, and Cu.

7. A method for manufacturing an ReRAM, the method comprising:
performing an electrodeposition with respect to a metal oxide nanowire inside a micropore array of a porous template to form a cell array;
forming a first electrode on an upper portion of the cell array; and forming a second electrode on a lower portion of the cell array, wherein the first electrode is electrically connected to an upper protrusion of the metal oxide nanowire, the upper protrusion being exposed to an upper portion of the porous template, and/or the second electrode is electrically connected to a lower protrusion of the metal oxide nanowire, the lower protrusion being exposed to a lower portion of the porous template.

8. The method of claim 7, wherein the porous template is a PAO template formed by anodizing an aluminum plate or aluminum film.

9. The method of claim 7, wherein the metal oxide nanowire is any one of NiO, $TiO_2$, $VO_2$, $Fe_2O_3$, $CoO_2$, $WO_3$, $RuO_2$, $IrO_2$, and $SnO_2$.

10. The method of claim 7, wherein the first electrode or the second electrode includes a metal thin film of any one selected from a group consisting of Au, Pt, Al, Ag, Cr, and Cu.

11. The method of claim 7, wherein the performing of the electrodeposition includes:
anodizing a metal substrate to prepare the porous template including the micropore array; and
performing an electrodeposition of the metal oxide nanowire on the porous template.

12. The method of claim 11, wherein the anodizing of the metal substrate includes:
performing a first anodization on the metal substrate to form an oxidized metal substrate on an upper portion of the metal substrate;
eliminating the oxidized metal substrate from the metal substrate, and performing a second anodization on the metal substrate to form the porous template including an anodized part where the micropore array is formed;
separating the porous template from the metal substrate; and
eliminating a barrier layer forming the lower portion of the micropore array.

13. The method of claim 12, wherein the anodizing of the metal substrate further includes:
depositing a metal thin film on a surface of the porous template.

14. The method of claim 13, wherein the metal thin film includes a metal thin film of any one selected from a group consisting of Au, Pt, Al, Ag, Cr, and Cu.

15. The method of claim 11, wherein the performing of the electrodeposition of the metal oxide nanowire on the porous template includes:
forming a metal nanowire inside the micropore array;
oxidizing the metal nanowire to the metal oxide nanowire; and
etching the porous template so that the metal oxide nanowire is exposed to the upper and lower portions of the porous template.

* * * * *